United States Patent
Maltabes et al.

(10) Patent No.: US 6,495,802 B1
(45) Date of Patent: Dec. 17, 2002

(54) TEMPERATURE-CONTROLLED CHUCK AND METHOD FOR CONTROLLING THE TEMPERATURE OF A SUBSTANTIALLY FLAT OBJECT

(75) Inventors: John G. Maltabes, Austin, TX (US); Alain B. Charles, Singapore (SG); Karl E. Mautz, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/871,854

(22) Filed: May 31, 2001

(51) Int. Cl.[7] ............................................. C23C 16/00
(52) U.S. Cl. .................. 219/390; 219/405; 219/411; 118/724; 118/725; 392/416; 392/418
(58) Field of Search ................. 219/390, 405, 219/411; 392/416, 418; 118/724, 725, 50.1

(56) References Cited

U.S. PATENT DOCUMENTS 6,229,116 B1 * 5/2001 Shirakawa et al. ......... 219/390

* cited by examiner

Primary Examiner—Teresa Walberg
Assistant Examiner—Shawntina T. Fuqua

(57) ABSTRACT

The present invention generally relates to a method for controlling the temperature of a substantially flat object and to a temperature-controlled chuck comprising a chuck body (20) having an object support side (21) and a back side (22). Said object support side (21) holds a substantially flat object (1) having a front side (2) and a back side (3) on said back side (3) of said object (1). A plurality of temperature sensing elements (4) is distributed on said object support side (1) to measure the temperature distribution of said flat object (1). A plurality of individual temperature influencing elements (6; 8; 9) is distributed on said object support side (21) to face said back side (3) of said flat object (1), each of said temperature influencing elements (6; 8; 9) being arranged to influence the temperature of a partial area of said object's back side (3) as desired.

13 Claims, 3 Drawing Sheets

TEMPERATURE-CONTROLLED CHUCK AND METHOD FOR CONTROLLING THE TEMPERATURE OF A SUBSTANTIALLY FLAT OBJECT

FIELD OF THE INVENTION

The present invention generally relates to controlling the temperature of partial areas of a substantially flat object. More particularly, the present invention relates to a temperature-controlled chuck to hold a substantially flat object. With such a temperature-controlled chuck the temperature distribution of the substantially flat object can be sensed or measured, and due to temperature influencing elements the temperature of partial areas of said object's back side can be altered to obtain a more uniform temperature distribution. Furthermore, the present invention relates also to a temperature-controlled wafer chuck and a method for controlling the temperature of a substantially flat object such as a wafer. Finally, the invention relates also to a pre-align station of an exposure tool for wafers comprising a temperature-controlled wafer chuck, and relates to an exposure wafer chuck in an exposure tool for wafers comprising a wafer chuck with which the temperature of a wafer can be measured and influenced as desired.

BACKGROUND OF THE INVENTION

Integrated circuits are typically constructed by depositing a series of individual layers of predetermined materials on a wafer-shaped semi-conductor substrate, or "wafer". The individual layers of the integrated circuit are in turn produced by a series of manufacturing steps. For example, in forming an individual circuit layer on a wafer containing a previously formed circuit layer, an oxide such as silicon dioxide is deposited over the previously formed circuit layer to provide an insulating layer for the circuit. A pattern for the next circuit layer is then formed on the wafer using a radiation alterable material, known as photoresist.

Photoresist materials are generally composed of a mixture of organic resins, sensitizers and solvents. Sensitizers are compounds such as diazonaphthaquinones, that under go a chemical change upon exposure to radiant energy, such as visible and ultraviolet light. The irradiated sensitizer material has different solution characteristics with respect to various solvents than the non-irradiated material allowing for selective removal of the photoresist. Resins are used to provide mechanical strength to the photoresist and the solvents serve to lower the viscosity of the photoresist so that it can be uniformly applied to the surface of the wafers.

After a photoresist layer is applied to the wafer surface, the solvents are evaporated and the photoresist layer is hardened, usually by heat treating the wafer. The photoresist layer is then selectively irradiated through the use of a radiation opaque mask. The mask contains transparent portions that define the pattern for the next circuit layer. The mask is placed over the photoresist layer and the photoresist covered by the transparent portion is irradiated. The wafer is removed and the photoresist layer is exposed to a process liquid, known as developer. The developer selectively solubilizes and removes either the irradiated or the nonirradiated photoresist exposing portions of the underlying insulating layer.

The exposed portions of the insulating layer can be selectively removed using an etchant to expose corresponding sections of the underlying circuit layer. In this process, the photoresist should be more resistant to the etchant than the insulating layer to limit the attack of the etchant to only the exposed portions of the insulating layer. Alternatively, the exposed underlying layer(s) can be implanted with ions which do not penetrate the photoresist layer thereby selectively penetrating only those portions of the underlying layer not covered by the photoresist. The remaining photoresist is then stripped using either a solvent, or a strong oxidizer in the form of a liquid or a gas in the plasma state. The next layer is then deposited and the process is repeated until fabrication of the semiconductor device is complete.

Thermal gradients in wafers during lithography exposure create linear pattern transfer effects due to expansion or contraction. Wafers can have temperature instability due to previous processing from a photoresist track hot plate. If this bake is non-uniform or the cooling prior to wafer transfer into the exposure tool is not complete, non-linear effects will occur. During the transfer from the track to the exposure tool there may not be adequate time for the wafer to thermally stabilize prior to exposure. This effect causes pattern transfer errors, seen as overlay or grid distortion and chip magnification errors. Other sources of non-linear errors can occur outside of lithography processing. These sources include rapid thermal processing such as anneal (RTA), film deposition processing (such as diffusion or chemical vapor deposition-CVD), and chemical mechanical polishing (CMP). These non-linear errors are variable across the wafer and are difficult to correct when severe.

A temperature difference as small as 0.1° C. can affect overlay. Wafers can only equilibrate through conduction with the exposure tool environment or contact with non-temperature regulated surfaces, so-called chucks. There are defects during lithography processing known as "banana effect" problems due to wafer contact non-uniformity on the track hotplate that cause significant temperature gradients over the wafer that result in overlay issues in these areas. Banana effect non-linear errors typically occur on the edge regions of the wafer in a semicircle pattern that resembles a banana shape. The magnitude of these non-linear errors varies significantly across the effected region, and therefore are difficult to correct using normal lithography processing.

Thus, it is apparent that a need exists for an improved chuck to hold a substantially flat object such as a wafer and a method for controlling the temperature of a wafer in a pre-align station or an exposure tool, which overcomes, among other things, the above-discussed problems to produce a more uniform temperature distribution over the surface of the wafer.

Furthermore, it is an object to provide an improved chuck with which the temperature of localized areas of a generally flat object, particularly a wafer, can be influenced in a desired manner to reduce significant temperature gradients over the wafer or to use defined temperature peaks or temperature depths in localized areas of a wafer to reduce or eliminate distortions of the wafer grid.

BRIEF SUMMARY OF THE INVENTION

The above objects and others are accomplished by a temperature-controlled chuck and a method for controlling the temperature of a substantially flat object such as a semiconductor wafer, in accordance with the present invention. The temperature-controlled chuck according to the invention comprises a chuck body having an object support side and a back side, said object support side holding a substantially flat object having a front side and a back side on said back side of said object. A plurality of temperature sensing elements is distributed on said object support side to measure the temperature distribution of said object. A plurality of individual temperature influencing elements is distributed on said object support side to face said back side of said flat object, each of said temperature influencing elements being arranged to influence the temperature of a partial area of said object's back side as desired.

A temperature-controlled chuck according to the invention provides the possibility to influence the temperature of a wafer, particularly the back side of a wafer, in a partial area in a manner as desired. For example, by use of an inventive temperature-controlled chuck the temperature can be varied precisely in tenths of a degree centigrade and be controlled overall to ±1° C. Hence, a good temperature uniformity across the whole wafer would be provided. It is also possible to provide local modification to correct process distortions on a wafer. If, for example, the temperature in partial areas of the wafer can be precisely controlled, then it is also possible to use a variation of the chuck temperature to adjust for chip magnification error, instead of changing lens, housing pressure or having an extra field lens for magnification adjustment. It could also be used in conjunction with current lens magnification correction systems, so that a coarse chip mag correction would be done using temperature adjustment while the fine correction will be still done as of today. With such a preferred embodiment of the invention, a simpler lens design for an exposure tool is possible, and hence such an exposure tool can be constructed more cheaply.

A preferred embodiment of an inventive temperature-controlled chuck comprises a plurality of piezoelectric elements, each piezoelectric element being individually controllable, such that each piezoelectric element is able to influence a localized area or a partial area of the object's back side. Due to a variation of the current and/or the voltage applied to the piezoelectric elements, the temperature of the object's back side can be controlled in a desired manner.

A further embodiment of an inventive temperature-controlled chuck comprises the above-mentioned temperature influencing piezoelectric elements. At least some of these piezoelectric elements are arranged such that they are able to contact the back side of a flat object such as a wafer. Due to the contact of the piezoelectric elements with said back side of said flat object, influencing of the temperature of the back side of said flat object is improved.

In an alternate embodiment of the invention a plurality of support pin elements are distributed on said object support side and arranged to contact said back side of said flat object. In such an embodiment of the invention, the wafer is held on the support pin elements and piezoelectric elements also distributed between the support pin elements serve to measure or sense the temperature and serve to influence the temperature in a desired manner.

Another embodiment of the invention comprises individual fiber optics being illuminated with infrared radiation to influence the temperature of localized areas of the object's back side.

If fiber optics as mentioned above are used to influence the temperature of localized areas of the object's back side, in a referred embodiment of the invention the tops of these temperature influencing fiber optics are arranged such that they are spaced from the object's back side.

A further preferred embodiment of the invention comprises a plurality of fiber optics illuminated with infrared radiation and a plurality of piezoelectric elements as temperature influencing elements. Due to the combination of fiber optics and piezoelectric elements a better temperature distribution of the object's back side and a better influence of the temperature distribution can be achieved.

An alternative embodiment of the invention comprises also heat sink pins and heating elements as temperature influencing elements. Hence, in such an embodiment localized areas of the object's back side can not only be heated but also be cooled.

Due to the use of temperature influencing elements which are selectively movable in close proximity with and away from said back side of said flat object, a better influence of the temperature of a localized area of the object's back side is achievable.

Another embodiment of the invention comprises a temperature controller connected to that plurality of individual temperature influencing elements to control the temperature distribution of said flat object in a desired manner.

A preferred embodiment of the invention refers to a temperature-controlled wafer chuck comprising a chuck body having a wafer support side and a back side opposing said wafer support side, said wafer support side being adapted to hold a wafer having a front side and a back side on the object's back side. A plurality of temperature sensing elements is distributed on said wafer support side, each of said temperature sensing elements being arranged to sense the temperature of a partial area of said wafer back side. A plurality of individual temperature influencing elements is distributed on said wafer support surface, each of said temperature influencing elements being arranged to influence the temperature of a partial area of said wafer back side. A temperature controller is connected to said plurality of temperature sensing elements and said plurality of individual temperature influencing elements to control and/or regulate the temperature distribution of said flat object in a desired manner.

A preferred embodiment of such a temperature-controlled wafer chuck comprises a temperature controller including at least one temperature detector and a control unit connected with said at least one temperature detector and controlling said temperature influencing elements.

A preferred inventive method for controlling the temperature of a substantially flat object having a front side and a back side and being supported on said back side comprises the method steps of sensing the temperature of partial areas of the back side of said flat object, determining the object's temperature distribution on the basis of the temperatures measured in said temperature sensing step, and changing the temperature in at least some of said partial areas of said back side of said flat object in a desired manner.

The method is particularly for controlling the temperature of a wafer held on a wafer chuck.

In a preferred method according to the invention, the temperature of a partial area of said flat object is measured by a temperature sensing element of a plurality of temperature sensing elements distributed over the back side of said flat object.

In a preferred embodiment these temperature sensing elements consist of a piezoelectric element.

In a preferred method according to the invention the temperature of a partial area of said flat object is influenced by a temperature influencing element of a plurality of temperature influencing elements distributed over the back side of said flat object.

In a preferred embodiment each temperature influencing element is an IR-optical fiber.

In another preferred embodiment of the inventive method each temperature influencing element is a heat sink pin.

In an alternative embodiment of the inventive method a piezoelectric element is used as a temperature influencing element.

Another embodiment of the inventive method includes IR-optical fibers and piezoelectric elements and heat sink pins as temperature influencing elements.

A preferred embodiment of a pre-align station of an exposure tool for wafers comprises:
chuck body having a wafer support side and a back side opposing said wafer support side, said wafer support side being adapted to hold a wafer having a front side and a back side on the object's back side. A plurality of temperature sensing elements is distributed on said wafer support side, each of said temperature sensing elements being arranged to sense the temperature of a partial area of said wafer back side. A plurality of individual temperature influencing elements is distributed on said wafer support surface, each of said temperature influencing elements being arranged to influence the temperature of a partial area of said wafer back side. A temperature controller is connected to said plurality of temperature sensing elements and said plurality of individual temperature influencing elements to control the temperature distribution of said flat object as desired.

A preferred embodiment of an exposure chuck in an exposure tool for wafers comprises
a chuck body having a wafer support side and a back side opposing said wafer support side, said wafer support side being adapted to hold a wafer having a front side and a back side on the object's back side. A plurality of temperature sensing elements is distributed on said wafer support side, each of said temperature sensing elements being arranged to sense the temperature of a partial area of said wafer back side. A plurality of individual temperature influencing elements is distributed on said wafer support surface, each of said temperature influencing elements being arranged to influence the temperature of a partial area of said wafer back side. A temperature controller is connected to said plurality of temperature sensing elements and said plurality of individual temperature influencing elements to control the temperature distribution of said flat object as desired.

BRIEF DESCRIPTION OF THE DRAWINGS

Preferred embodiments of the present invention will be described in greater detail with reference to the accompanying drawings, wherein like members bear like reference numerals and wherein.

DETAILED DESCRIPTION OF PREFERRED EMBODIMENTS OF THE INVENTION

The present invention provides an improved wafer chuck, especially an improved lithography wafer chuck, that is especially useful for holding small as well as large wafers, such as having a diameter of, for example, 300 mm.

Figure 1:
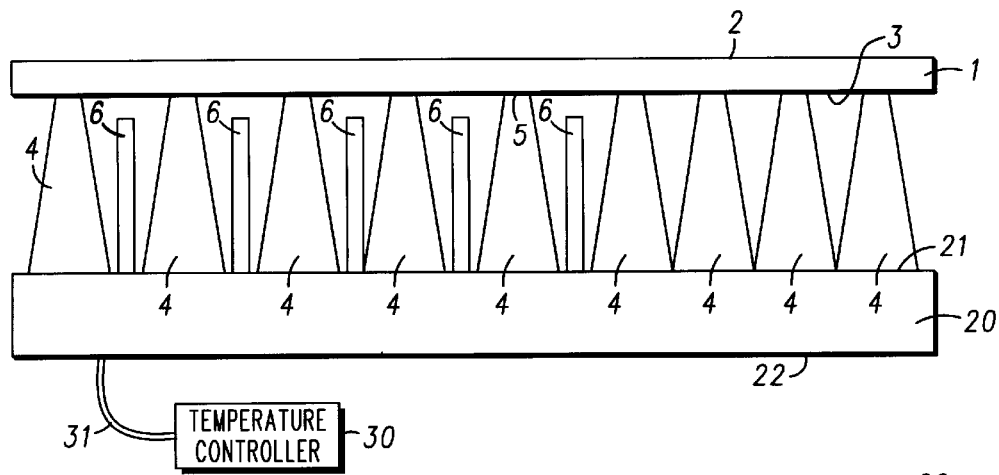
FIG. 1 is a schematic side view of a wafer chuck according to a first embodiment of the present invention.

FIG. 1 illustrates simplified a side view of a wafer chuck body 20 having a wafer support side 21 and a back side 22 opposing said wafer support side. On the wafer support side 21 a plurality of piezoelectric pin elements 4 are distributed. These piezoelectric pins 4 have a top surface 5 arranged to support a back side 3 of a wafer 1. The wafer 1 has also a front side 2 opposing the wafer's back side 3, which will be exposed in an exposure tool.

Figure 2:
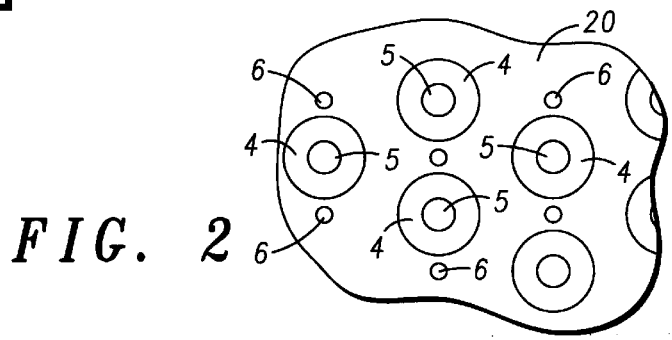
FIG. 2 is a schematic top plan view of the wafer chuck in FIG. 1 showing the distribution of piezoelectric elements and IR-fiber optics.

Each piezoelectric pin 4 projects from the wafer support side 21 of the wafer chuck body 20 and are evenly distributed on the wafer support side 21, as illustrated in FIG. 2. If preferred, the piezoelectric elements 4 can also be unevenly distributed. Between the piezoelectric elements IR-fiber optics 6 are arranged. These fiber optics 6 project from the wafer support side 21 of the chuck body 20, but the tops of these fiber optics are not as high as the tops of the piezoelectric elements 4. Hence, the tops of the fiber optics 6 do not contact the wafer's back side 3. As shown in FIG. 1, a temperature controller 30 is connected with each piezoelectric element 4 and each IR-fiber optic 6 via a lead 31.

Referring to FIG. 2, a partial area of the wafer chuck body 20 is shown in a top plan view.

Here, the tops of the piezo electric elements 4 and the IR-fiber optics 6 are illustrated. The operation of a wafer chuck shown in FIGS. 1 and 2 is as follows:

A wafer 1 is laid down on the top surface 5 of the piezoelectric pins 4 such that the wafer 1 lies on the top surface 5 of the piezoelectric pins 4 with the wafer's back side 3. Now, by sensing or measuring a ΔV (voltage difference) of each piezoelectric pin 4 a ΔT on the wafer's back side is measured. Hence, the temperature distribution on the wafer's back side 3 is available. In the preferred embodiment according to FIGS. 1 and 2 the temperature is now adjusted by using the IR-fiber optics 6. Due to the temperature controller 30 it is possible to control each IR-fiber optic such that the temperature of a partial area of the wafer's back side 3 can be influenced in a desired manner, that means here the temperature can be increased. The temperature increase of the partial area accompanying a fiber optic 6 can be achieved by varying the pulse and intensity of the IR radiation.

Then again, the wafer distribution is measured by the piezoelectric elements 4. Again, if necessary, one or more fiber optics 6 are activated as necessary to achieve a temperature distribution within a desired temperature range, for example, 0.1° C.

It is to be noted that it is also possible to use holding pins instead of piezoelectric pins. The temperature is in such an embodiment measured by normal temperature sensing elements.

Figure 3:
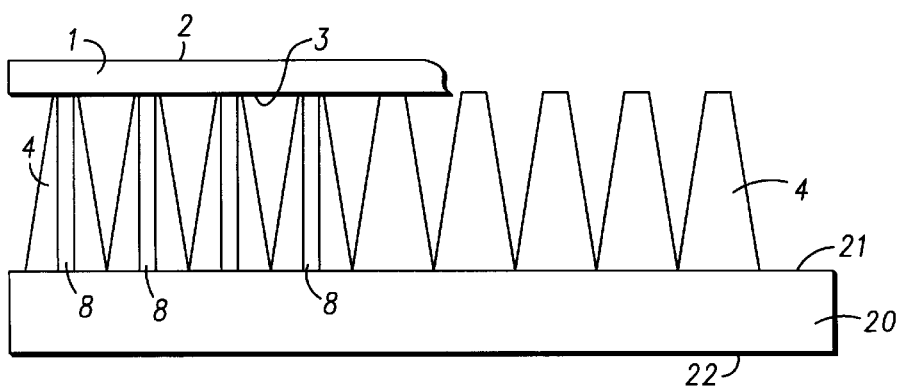
FIG. 3 is a schematic side view of a second embodiment of a wafer chuck according to the present invention.
Figure 4:
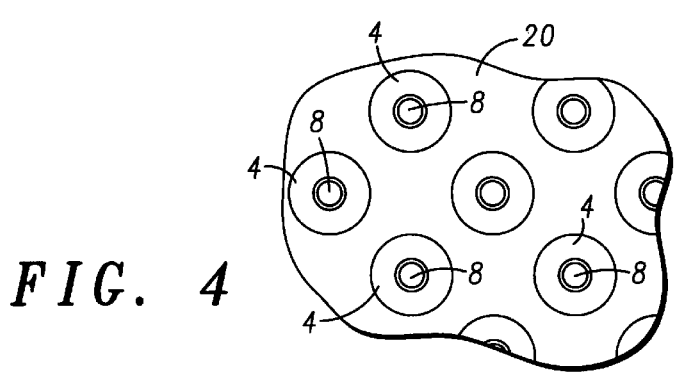
FIG. 4 is a schematic top plan view of the second embodiment of the wafer chuck of FIG. 3.

The second embodiment of the wafer chuck according to the invention is shown in FIGS. 3 and 4. Here, contrary to the first embodiment of FIGS. 1 and 2, the IR-fiber optics 8 are arranged in the center of the piezoelectric pins 4. The distribution of the piezoelectric pins 4 and the centered IR-fiber optics 8 is illustrated in FIG. 4. With such an arrangement a higher density of piezoelectric elements and temperature influencing fiber optics 8 is achievable. Hence, the temperature distribution of the wafer's back side 3 can be measured in a higher number of partial areas of the wafer's back side 3.

The operation of the second embodiment according to FIGS. 3 and 4 is similar to the operation of the first embodiment.

Figure 5:
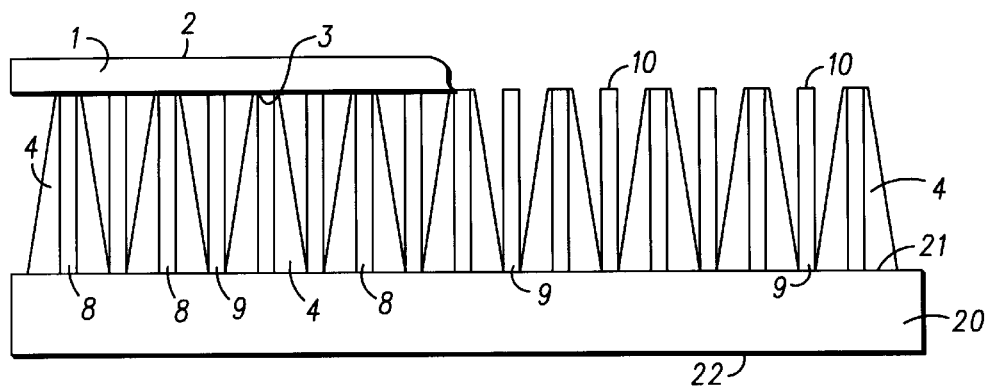
FIG. 5 is a schematic side view of a third embodiment of a wafer chuck according to the invention.
Figure 6:
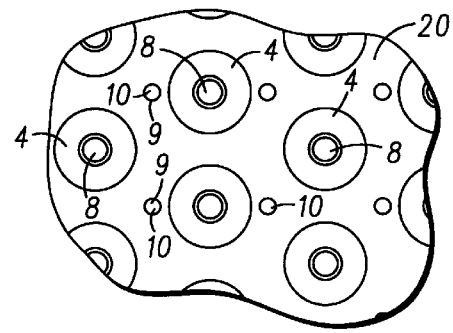
FIG. 6 is a schematic top plan view of the third embodiment of the wafer chuck according to the invention.

A third embodiment of the wafer chuck according to the invention is shown in FIGS. 5 and 6. Contrary to the second embodiment shown in FIGS. 3 and 4, here heat sink pins 9 are distributed between the piezoelectric pins 4 having in the center a fiber optic 8. Again, the distribution of these elements mentioned above is shown in FIG. 6 in a schematic manner.

Here, the temperature of a partial area of the wafer's back side 3 can be influenced such that the temperature can be increased or decreased. The temperature of a partial area of the wafer's back side 3 can now be increased or decreased by activating one or more fiber optic elements 8 and heat sink pins 9, respectively. Again, a temperature controller is arranged to control the heat sink pins 9, the IR-fiber optic elements 8 and the piezoelectric elements 4.

It is to be noted that the top surfaces 10 of the heat sink pins 9 do not contact the wafer's back side 3. If desired, it is also possible that these surfaces 10 contact the wafer's back side 3 to carry off heat from the wafer's back side 3.

Figure 7:
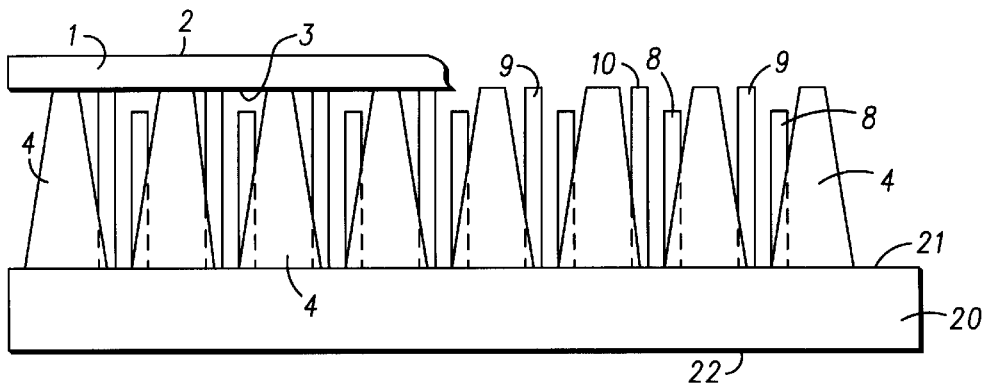
FIG. 7 is a schematic side view of a fourth embodiment of the wafer chuck according to the invention.
Figure 8:
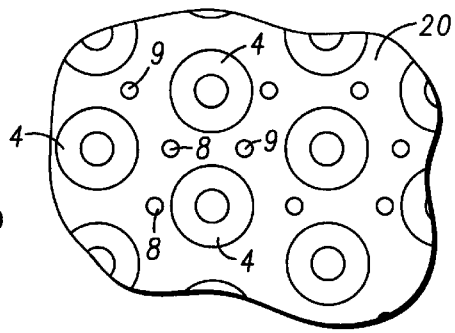
FIG. 8 is a schematic top plan view of the fourth embodiment of the wafer chuck of FIG. 7.

In a further preferred embodiment according to FIGS. 7 and 8, the fiber optics 8 are not arranged in the center of the piezoelectric elements 4, but are separate elements. All other features are similar to the embodiments shown in FIGS. 5 and 6. In FIG. 8 the distribution of the piezoelectric elements 4, the heat sink pins 9 and the IR-fiber optic elements 8 is illustrated schematically.

Figure 9:
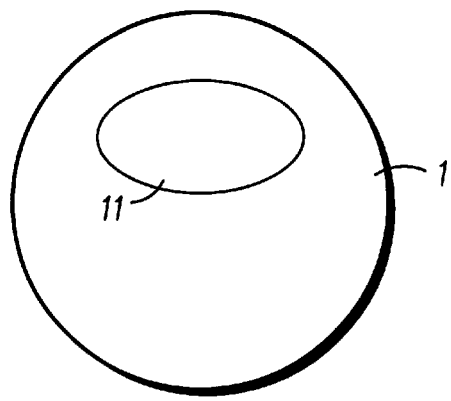
FIG. 9 is a schematic top plan view of the back side of a wafer having a localized area with a localized area having a temperature lower than the average temperature of the wafer's back side.

If, as for example shown in FIG. 9, a wafer's back side 3 has a localized area 11 with a temperature lower than the average temperature of the wafer 1, these temperature influencing elements 4, 8, 9 facing this localized area 11 of the wafer 1 can be activated such that a more even temperature distribution of the wafer's back side 3 is achievable.

Figure 10:
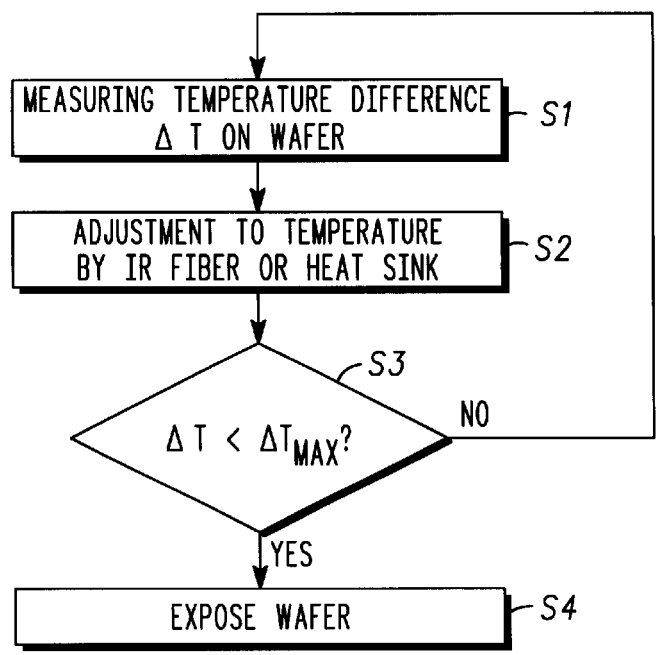
FIG. 10 is a schematic flow diagram of a preferred embodiment of the method according to the invention.

In the flow diagram of FIG. 10 the various method steps of the method according to the invention are shown. In a method step S1 the temperature difference $\Delta T$ on the wafer's back side is measured. If necessary, to obtain a more even temperature distribution of the wafer in a method step S2 the temperature is adjusted by activating one or more IR fiber optics or heat sinks or a combination of IR fiber optics and heat sinks or of piezo electric elements. If $\Delta T$ is equal or less than $\Delta T_{max}$ then the wafer is exposed in a method step S4. If $\Delta T$ is greater than $\Delta T_{max}$ again the temperature difference $\Delta T$ on the wafer's back side is measured and in a method step S2 the temperature is adjusted. Here, $\Delta T_{max}$ is about 0.1° C. or within the range of 0.1° C. and 1° C.

What is claimed is:

1. A temperature-controlled chuck to hold a substantially flat object, comprising:
    a chuck body having an object support side and a backside, said object support side holding a substantially flat object having a front side and a backside on said backside of said object,
    a plurality of temperature sensing elements being distributed on said object support side to measure the temperature distribution of said flat object, and
    a plurality of individual temperature influencing elements being distributed on said object support side to face said backside of said flat object, each of said temperature influencing elements being arranged to influence the temperature of a partial area of said object's backside as desired;
    wherein said temperature influencing elements are piezoelectric elements, each piezoelectric element being individually controllable.

2. The temperature-controlled chuck of claim 1, wherein said temperature influencing piezoelectric elements contact said backside of said flat object.

3. The temperature-controlled chuck of claim 1, wherein a plurality of support pin elements are distributed on said object support side and being arranged to contact said backside of said flat object.

4. A temperature-controlled chuck to hold a substantially flat object, comprising:
    a chuck body having an object support side and a backside, said object support side holding a substantially flat object having a front side and a backside on said backside of said object,
    a plurality of temperature sensing elements being distributed on said object support side to measure the temperature distribution of said flat object, and
    a plurality of individual temperature influencing elements being distributed on said object support side to face said backside of said flat object, each of said temperature influencing elements being arranged to influence the temperature of a partial area of said object's backside as desired;
    wherein said temperature influencing elements are individual fiber optics, said fiber optics being illuminated with infrared radiation.

5. The temperature-controlled chuck of claim 5, wherein said temperature influencing fiber optics are spaced from said object's backside.

6. The temperature-controlled chuck of claim 4, wherein said temperature influencing elements further comprise a plurality of piezoelectric elements.

7. A temperature-controlled chuck to hold a substantially flat object comprising:
    a chuck body having an object support side and a backside, said object support side holding a substantially flat object having a front side and a backside on said backside of said object,
    a plurality of temperature sensing elements being distributed on said object support side to measure the temperature distribution of said flat object, and
    a plurality of individual temperature influencing elements being distributed on said object support side to face said backside of said flat object, each of said temperature influencing elements being arranged to influence the temperature of a partial area of said object's backside as desired;
    wherein said temperature influencing elements comprise heat sink pins and heating elements.

8. A temperature-controlled chuck to hold a substantially flat object, comprising:
    a chuck body having an object support side and a backside, said object support side holding a substantially flat object having a front side and a backside on said backside of said object,
    a plurality of temperature sensing elements being distributed on said object support side to measure the temperature distribution of said flat object, and
    a plurality of individual temperature influencing elements being distributed on said object support side to face said backside of said flat object, each of said temperature influencing elements being arranged to influence the temperature of a partial area of said object's backside as desired;

wherein said temperate influencing elements are selectively movable into close proximity with and away from said backside of said flat object.

9. A method for controlling the temperature of a substantially flat object having a front side and a backside and being supported on said backside, comprising the method steps:

sensing the temperature of partial areas of said backside of said flat object, determining the object's temperature distribution on the basis of the temperatures measured in said temperature sensing step, and changing the temperature in some of said partial areas of said backside of said flat object as desired;

wherein the temperature of the partial areas of said flat object is measured by a temperature sensing element of a plurality of temperature sensing elements distributed over the backside of said flat object; and wherein each temperature sensing element is a piezoelectric element.

10. A method for controlling the temperature of a substantially flat object having a front side and a backside and being supported on said backside, comprising the method steps:

sensing the temperature of partial areas of said backside of said flat object, determining the object's temperature distribution on the basis of the temperatures measured in said temperature sensing step, and changing the temperature in some of said partial areas of said backside of said flat object as desired;

wherein the temperature of the partial areas of said flat object is influenced by a temperature influencing element of a plurality of temperature influencing elements distributed over the backside of said flat object; and wherein each temperature influencing element is an IR-optical fiber.

11. A method for controlling the temperature of a substantially flat object having a front side and a backside and being supported on said backside, comprising the method steps:

sensing the temperature of partial areas of said backside of said flat object, determining the object's temperature distribution on the basis of the temperatures measured in said temperature sensing step, and changing the temperature in some of said partial areas of said backside of said flat object as desired;

wherein the temperature of the partial areas of said flat object is influenced by a temperature influencing element of a plurality of temperature influencing elements distributed over the backside of said flat object; and wherein each temperature influencing element is a heat sink pin.

12. A method for controlling the temperature of a substantially flat object having a front side and a backside and being supported on said backside, comprising the method steps:

sensing the temperature of partial areas of said backside of said flat object, determining the object's temperature distribution on the basis of the temperatures measured in said temperature sensing step, and changing the temperature in some of said partial areas of said backside of said flat object as desired;

wherein the temperature of the partial areas of said flat object is influenced by a temperature influencing element of a plurality of temperature influencing elements distributed over the backside of said flat object; and wherein each temperature influencing element is a piezoelectric element.

13. The method of claim 12, wherein said plurality of temperature influencing elements further comprise IR-optical fibers and heat sink pins.

* * * * *